United States Patent [19]
Hall et al.

[11] Patent Number: 5,444,400
[45] Date of Patent: Aug. 22, 1995

[54] LOGIC OUTPUT CIRCUIT WITH HIGH TRANSIENT PULL-UP CURRENT

[75] Inventors: Steven G. Hall; Lawrence N. Taugher; Kerry J. Monroe, all of Fort Collins; Christian J. Warling; Thomas L. Bloom, both of Loveland; William P. Repasky, Fort Collins; Erik R. Habbinga, Longmont, all of Colo.

[73] Assignee: Hewlett-Packard Company, Palo Alto, Calif.

[21] Appl. No.: 146,254

[22] Filed: Nov. 2, 1993

[51] Int. Cl.⁶ .............................. H03K 17/04
[52] U.S. Cl. .................. 327/108; 327/111; 327/320; 327/112
[58] Field of Search ............... 307/270, 443, 559, 263; 327/108, 111, 134, 112, 320, 478, 379; 326/26, 31

[56] References Cited

U.S. PATENT DOCUMENTS

| | | | |
|---|---|---|---|
| 3,609,405 | 9/1971 | Surprise | 327/108 |
| 4,070,600 | 1/1978 | Butler et al. | 307/270 |
| 4,089,651 | 8/1987 | Hanna et al. | 307/559 |
| 4,419,593 | 12/1983 | Butler et al. | 327/108 |
| 4,424,455 | 1/1984 | Neely | 307/446 |
| 4,445,052 | 4/1984 | Higashi | 307/446 |
| 4,525,639 | 6/1985 | Nonaka | 307/446 |
| 5,177,377 | 1/1993 | Mathuda et al. | 307/443 |

*Primary Examiner*—Timothy P. Callahan
*Assistant Examiner*—Jung Ho Kim
*Attorney, Agent, or Firm*—Augustus W. Winfield

[57] ABSTRACT

A digital line driver circuit with active pull-down, high transient pull-up current, and limited steady-state pull-up current. Steady-state pull-up current is provided through a pull-up resistor. Transient pull-up current is provided by a capacitively coupled active pull-up circuit.

2 Claims, 1 Drawing Sheet

LOGIC OUTPUT CIRCUIT WITH HIGH TRANSIENT PULL-UP CURRENT

FIELD OF INVENTION

This invention relates generally to digital electronic circuits and more specifically to line driver circuits.

BACKGROUND OF THE INVENTION

Digital circuits driving bus systems or input/output cables often have requirements for driving relatively high capacitance lines. Some systems are designed to require fast fall-times only, in which open-collector circuits are used with passive pull-up. In other systems, fast rise times are also required. Typically, fast rise times are achieved by providing high-current active pull-up and pull-down driver circuits, sometimes called "totem-pole" driver circuits. In some systems, however, multiple devices may be able to pull a line low or some devices on the same line may be powered off. In addition, damage can occur if a line is accidently shorted to ground. Some current limitation is needed to prevent damage if a line is shorted, or if one device attempts to pull a line low while another device is pulling the line high or if some devices connected to a line are powered off. Existing solutions include adding series resistance to output drivers. When a line is pulled low through a series resistor, voltage drops across the series resistor can decrease noise margins. A solution is needed that provides high transient current to overcome line capacitance but limited steady state current to prevent damage due to shorts, or damage if devices have power off, or damage due to drive conflicts between devices.

SUMMARY OF THE INVENTION

The present invention provides a digital line driver circuit with active pull-down, high transient pull-up current, and limited steady-state pull-up current. Steady-state pull-up current is provided through a pull-up resistor. Transient pull-up current is provided by a capacitively coupled active pull-up circuit.

DETAILED DESCRIPTION OF THE PREFERRED EMBODIMENT OF THE INVENTION

Figure 1:
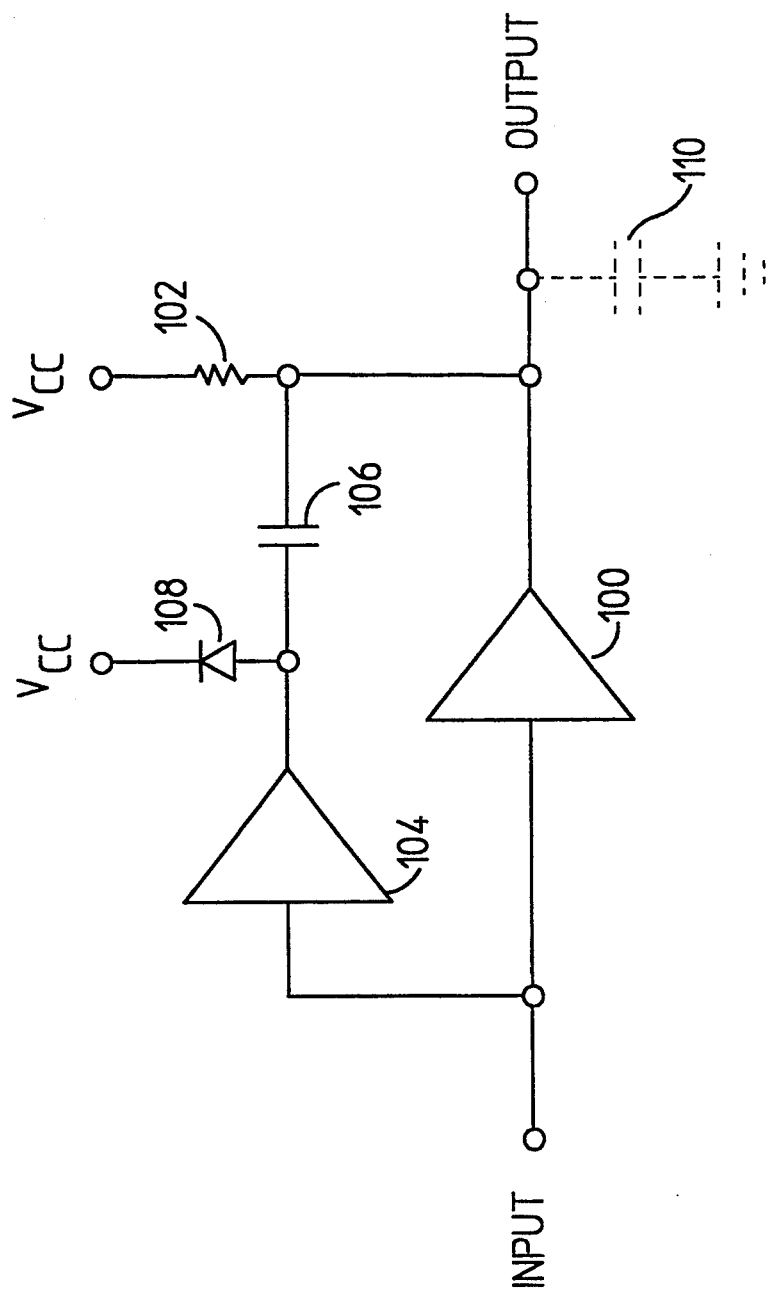
FIG. 1 is a block diagram schematic of a circuit having limited steady-state pull-up current.

FIG. 1 illustrates a circuit providing active pull-down, high transient pull-up current, and limited steady-state pull-up current. In FIG. 1, gate 100 is an open-collector driver with a resistor 102 providing steady-state pull-up current. Gate 104 is an active pull-up (totem-pole) driver. Capacitor 106 couples the initial pull-up transient current from gate 104 to the line capacitance 110 but blocks any steady-state current from gate 104. Diode 108 clamps the output of gate 104 to the power supply voltage $V_{cc}$ to prevent the output of gate 104 from rising above the power supply voltage. Some, but not all commercially available active pull-up drivers have internal clamping diodes and the external diode 108 enables use of devices with or without internal clamping diodes. Note that capacitance also couples pull-down transient so that fall times get the benefit of current sinking through both gate 100 and through gate 104.

In an example embodiment, the line capacitance (110) being driven is on the order of 4,000 pico-Farads. The resistor pull-up (102) is 1 KOhm. With a 5 V power supply, the 1 KOhm pull-up resistor (102) limits steady-state pull-up current to 5 mA. The resulting rise times without active pull-up are on the order of 8 microseconds. The active pull-up gate (104) can source 100 mA, thereby improving rise times by a factor of 20 relative to the resistor (102) alone but also providing enough steady-state current to damage MOS parts that are turned off. The series capacitor (106) is 0.01 micro-Farads. This capacitance is sufficient to enable rise times substantially equal to rise times provided by the active pull-up gate (104) acting alone and sourcing 100 mA. Therefore, the circuit provides the fast rise time of an active pull-up driver and the steady-state current limitation of an open-collector driver.

The foregoing description of the present invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. A binary line driver circuit having a power supply connection, the binary line driver circuit comprising:
   a first driver circuit having a first driver input and a first driver output, the first driver output having active pull-down;
   a resistor connected between the power supply connection and the first driver output;
   a second driver circuit having a second driver input connected to the first driver input and a second driver output, the second driver output having active pull-up; and
   a capacitor connected between the second driver output and the first driver output, the capacitor thereby capacitively coupling the second driver output to the first driver output and the resistor limiting steady state current from the power supply connection to the first driver output.

2. A binary line driver circuit as in claim 1 further comprising:
   a diode having an anode and a cathode, the anode connected to the second driver output and the cathode connected to the power supply connection.

* * * * *